United States Patent [19]

Remy

[11] 4,415,854

[45] Nov. 15, 1983

[54] MICROWAVE SPECTRUM ANALYZER WITH A SYNTHESIZED LOCAL OSCILLATOR

[75] Inventor: Joël Remy, Paris, France

[73] Assignee: Adret Electronique, France

[21] Appl. No.: 264,372

[22] Filed: May 18, 1981

[30] Foreign Application Priority Data

May 23, 1980 [FR] France ................................ 80 11564

[51] Int. Cl.³ .......................................... G01R 23/14
[52] U.S. Cl. .................................... 324/79 R; 324/84
[58] Field of Search ..................... 324/79 R, 79 D, 84

[56] References Cited

U.S. PATENT DOCUMENTS 3,978,403  8/1976  Mansfield .......................... 324/79 R Primary Examiner—Michael J. Tokar
Attorney, Agent, or Firm—William A. Drucker

[57] ABSTRACT

A microwave spectrum analyzer comprising a first mixer which provides beats between the output of an YIG oscillator and the spectrum to be analyzed. A second mixer carries out a fixed transposition of said beats. The said YIG oscillator is locked to harmonics of the frequency of an auxiliary oscillator controlled by a phase-frequency comparator. The latter is adapted to receive on the one hand the frequency, divided by N of a synthesizer, and on the other hand, the beats between the frequency of said auxiliary oscillator and that of a crystal oscillator.

1 Claim, 1 Drawing Figure

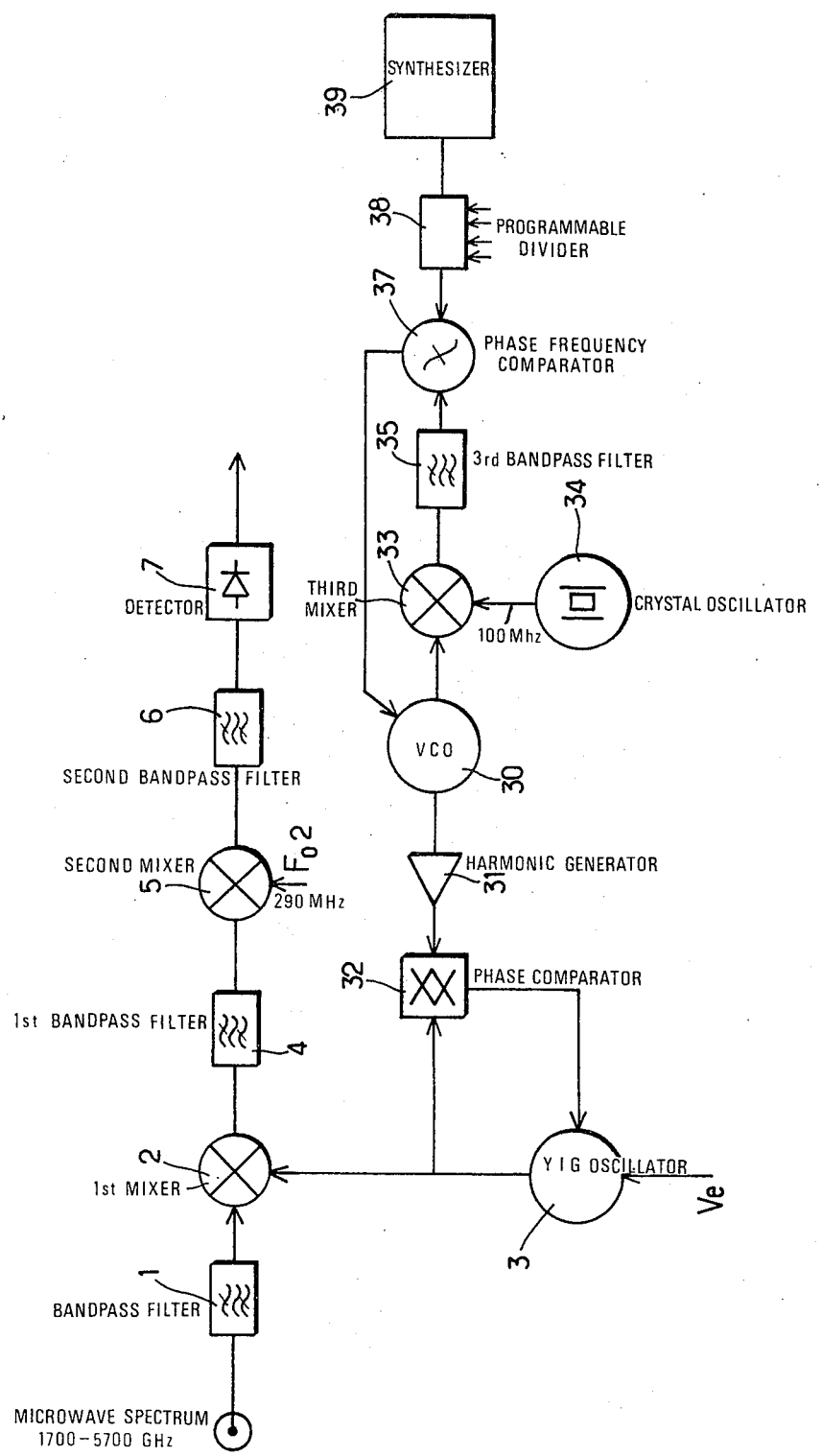

MICROWAVE SPECTRUM ANALYZER WITH A SYNTHESIZED LOCAL OSCILLATOR

BACKGROUND OF THE INVENTION

The present invention relates to spectrum analyzers and more especially to those that are intended for analyzing a microwave spectrum.

SUMMARY OF THE INVENTION

It is known, after having carried out a first filtration of the spectrum to be analyzed, to submit such a filtered spectrum to a first frequency transposition in a first mixer driven by a variable local oscillator controlled so as to carry out a frequency scanning and, after having filtered the thus obtained fixed intermediate first frequency, a second transposition in a second mixer energized by a fixed frequency. The thus obtained intermediate second frequency, situated in a range of frequencies much lower than those covered by the apparatus, is readily filtered and detected with a view to measuring the spectrum radiofrequency components.

Quite obviously, with such an arrangement, the spectrum purity of the signal delivered by the variable local oscillator must be higher than that of the signals to be analyzed, failing which the results of the analysis would be erroneous, as the noise level of the variable oscillator signal will be present in the said final results.

Through the use of an oscillator of the YIG type as a local oscillator, variable in a wide range of resonance frequencies through adjustment of the magnetic field, it is possible to meet such a requirement, except in those cases where the spectrum components to be analyzed are very near the carrier wave, and it results therefrom, as will be explained later on, that the YIG oscillator then operates in a portion of its spectrum corresponding to a relatively high noise level.

OBJECT OF THE INVENTION

The present invention aims at obviating such a drawback of the known circuit arrangements. It has for its object a microwave spectrum analyzer comprising: a first mixer having a first input to which is applied the spectrum to be analyzed, a second input and an output; a YIG oscillator having an output connected to the second input of the first mixer, said YIG oscillator further having a frequency control input; a first band-pass filter keyed to a fixed frequency substantially lower than the lowest frequency of the spectrum to be analyzed, said first filter having an input connected to the output of the first mixer and an output; a second mixer having an output, a first input connected to the output of the said filter, a second input receiving a fixed transposition frequency; a second band-pass filter having an input connected to the output of the second mixer and an output; a detector connected to the output of the second filter; a crystal oscillator of relatively low frequency; a harmonic generator having an input and an output; a voltage-controlled oscillator having a frequency control input and first and second outputs, the second output being connected to the input of the said harmonic generator; a third mixer having an output, a first input connected to the first output of the voltage-controlled oscillator and a second input connected to the crystal oscillator; a synthesizer, the frequency of which varies by increments substantially lower than the frequency of said crystal oscillator; a programmable divider having an input connected to said synthesizer and an output; phase-frequency comparator means having an output connected to the frequency control input of the voltage-controlled oscillator, a first input connected to the output of the programmable divider and a second input; a third band-pass filter having an input connected to the output of the third mixer and an output connected to the second input of the phase-frequency comparator, and a phase comparator having a first input connected to the output of the YIG oscillator, a second input connected to the output of the harmonic generator and an output connected to the frequency control input of the YIG generator.

BRIEF DESCRIPTION OF THE DRAWING

The sole FIGURE of the drawing schematically shows a microwave spectrum analyzer.

DESCRIPTION OF THE PREFERRED EMBODIMENT

The device such as shown in the sole FIGURE of the drawing comprises a filter (1), the bandwidth of which corresponds to the possible variations of the carrier wave of the microwave spectrum to be analyzed. This spectrum, applied to the input of filter (1), will have a carrier wave covering, e.g., the 1.700 to 5.700 GHz range. It is applied to a first mixer (2), the latter in addition, being fed by a variable frequency generated by an oscillator (3) of the YIG type. It is known that such an oscillator is provided with a resonator constituted by a ball of iron-yttrium garnet, endowed with the property that its resonant frequency varies within a broad range as a function of the neighbouring magnetic field. By way of example, with the help of means to be described later on and that form a feature of the present invention, the frequency of oscillator (3) will be called to vary within the 2000 to 6000 MHz-range. The 300 MHz substracting beat collected at the output of mixer (2) for each value of the oscillator frequency, is filtered by a band-pass filter (4), and is then submitted to a frequency transposition by means of a second mixer (5), adapted to receive a fixed frequency $F_{o2}$ of 290 MHz, in the example as described. The 10 MHz substracting beat collected at the output of mixer (5) is filtered by a band-pass filter (6) and it is then applied to a detector (7). The video component issuing from that detector represents the spectrum to be analyzed, however devoid of its carrier wave. For each value of the frequency of oscillator (3), the voltage at the output of the detector is measured, which permits to analyze the spectrum.

The device just described is known per se and the advantage thereof lies in the fact that the frequency transpositions carried out by means of units 2, 3 and 5 bring back the signal to be analyzed within a fixed frequency range (in the vicinity of 10 MHz in the example described), in which filtration and detection are carried out in the ordinary way. Quite obviously, in such a device, any defect of local oscillator (3) is taken into account in the measured final signal; that is why use is made of an YIG oscillator, such an oscillator, endowed with a Q factor of from 1000 to 3000, will deliver a signal of very high spectrum purity.

It is however to be noted that, in the case of spectrum components very near the carrier wave, for a given Q factor, the noise level of the oscillator is, in practice, much higher than in the case of components that are far from the carrier wave, with the risk of a poor performance in the case of some measurements.

In order to obviate the drawback, it is known to render the YIG oscillator dependent on a crystal oscillator, the resonator of which is endowed with a Q factor of about 100,000, by locking said YIG oscillator to successive harmonics forming a frequency "comb" issuing from said crystal oscillator. In such a case, it is of course preferable to use a crystal oscillator, the frequency of which is high enough for allowing the intrinsic noise of which to be multiplied (in order to reach the frequency of the YIG oscillator) only by an acceptable factor. It is possible, for instance, to resort to a crystal oscillator with a frequency of 100 MHz, which leads to a noise multiplication factor of 60 at the utmost. With such a known solution, the YIG oscillator will generate successive frequencies of 2000 MHz, 2100 MHz, 2200 MHz ... 6000 MHz and it will be therefore necessary to scan the 100 MHz intervals between said successive frequencies. A first solution consists in exchanging the fixed transposition carried out by mixer (5) for a variable transposition. In such an arrangement, mixer (5) should be replaced by an oscillator, the frequency of which would have to be caused to vary, by manual control, from 240 to 340 MHz. Filter (4) would then have to transmit a relatively broad range of frequencies, which, in some cases, would prevent it from eliminating the image frequency. Such a solution is therefore unacceptable in practice whenever it is intended to carry out a high quality spctrum analysis.

In the circuit arrangement such as described and shown, the YIG oscillator is controlled by a circuit means adapted to permit to control the frequency thereof within all the desired range, without any frequency gap, while referring said frequency to a crystal oscillator, by using the harmonics thereof, the rank of which is not too high, so that their spectral purity be satisfactory.

An oscillator 30, with a voltage-controlled frequency, feeds its output frequency to a harmonic generator (31) followed by a phase comparator (32), on the one hand, and to a mixer (33), on the other hand, said mixer, in addition, being fed by a standard frequency of 100 MHz delivered by a crystal oscillator (34). After filtration through a band-pass filter (35), the substractive beat is applied to a phase-frequency comparator (37), the latter in addition, receiving a frequency resulting from the division of the output frequency of a synthesizer (39) by a programmable factor N, carried out by a divider (38). Said synthesizer (39), the type of which is known per se, delivers a frequency that varies by small increments from 100 to 200 MHz. The output of comparator (37) is connected to the frequency-control input of oscillator (30).

For a frequency of 100 MHz $+\Delta$ provided by synthesizer (39), comparator (37), when stable rate of oscillator (30) has been reached, receives two frequencies equal to 1/N (100 MHz $+\Delta$). The frequency of oscillator (30) (provided that multiplicator (32) comprises a suitable control capable of generating the harmonics of rank N), is thus equal to $$\frac{100 \text{ MHz} + \Delta}{N} + 100 \text{ MHz},$$

so that the frequency of oscillator (3) is equal to N. 100 MHz+100 MHz+$\Delta$. In other words, that frequency varies by large increments of 100 MHz and covers the interval between two large increments with a small increment equal to the one provided by synthetizer (39), it being possible to render the latter increment as small as desired.

The frequency approach of oscillator (3) is provided by a manually controllable control voltage Ve. It is to be noted that the frequency of oscillator (30) will vary, for a frequency of oscillator (3) varying from 2000 to 6000 MHz, between limit bounds of about 110.7 and 101.7 MHz, and that such a variation will be according to sawtooth curve of decreasing amplitude: for instance, when the frequency of oscillator (3) increases from 2000 to 2100 MHz, the frequency of oscillator (30) increases from 105.2 to 110.7 MHz, then decreases abruptly to 105 MHz, whereas when the frequency of oscillator (3) increases from 5400 to 6000 MHz, the frequency of oscillator (30) increases from 101.72 to 103.4 MHz, then abruptly decreases to 101.69 MHz.

The result is that, finally, the frequency variations of oscillator (30) are small, with, accordingly, a very high spectrum purity, and that said variations are all the smaller as the frequency of the spectrum components to be measured is higher. The stray currents which are possibly generated by the frequency control will have a frequency high enough for being eliminated by preselection filter (1) and the image frequency will also be eliminated by said filter.

Quite obviously, various changes can be made in the above-described circuit arrangement without departing from the scope of the present invention. In particular, frequency $F_{o2}$ might vary by increments inserted in those of synthesizer (39).

I claim:

1. A microwave spectrum analyzer comprising: a first mixer having a first input to which is applied the spectrum to be analyzed, a second input and an output; a YIG oscillator having an output connected to the second input of the first mixer, said YIG oscillator further having a frequency control input; a first band-pass filter keyed to a fixed frequency which is outside the frequency range of the spectrum to be analyzed, said first filter having an input connected to the output of the first mixer and an output; a second mixer having an output, a first input connected to the output of the said filter, a second input receiving a fixed transposition frequency; a second band-pass filter having an input connected to the output of the second mixer and an output; a detector connected to the output of the second filter; a crystal oscillator of relatively low frequency; a harmonic generator having an input and an output; a voltage-controlled oscillator having a frequency control input and first and second outputs, the second output being connected to the input of the said harmonic generator; a third mixer having an output, a first input connected to the first output of the voltage-controlled oscillator and a second input connected to the crystal oscillator; a synthesizer, the frequency of which varies by increments substantially lower than the frequency of said crystal oscillator; a programmable divider having an input connected to said synthesizer and an output; phase-frequency comparator means having an output connected to the frequency control input of the voltage-controlled oscillator, a first input connected to a third band-pass filter having an input connected to the output of the third mixer and an output connected to the second input of the phase-frequency comparator, and a phase comparator having a first input connected to the output of the YIG oscillator, a second input connected to the output of the harmonic generator and an output connected to the frequency control input of the YIG generator.

* * * * *